United States Patent [19]

Riley

[11] Patent Number: 5,275,912
[45] Date of Patent: Jan. 4, 1994

[54] DUAL LAMINATE PROCESS FOR THERMAL COLOR PROOFING

[75] Inventor: John M. Riley, Rochester, N.Y.

[73] Assignee: Eastman Kodak Company, Rochester, N.Y.

[21] Appl. No.: 893,187

[22] Filed: Jun. 3, 1992

[51] Int. Cl.$^5$ .................. G03C 7/00; B41M 5/035; B41M 5/26

[52] U.S. Cl. .................. 430/200; 430/201; 430/256; 503/227

[58] Field of Search ......... 503/227; 430/201, 200, 430/199, 256, 257; 156/344, 584

[56] References Cited

U.S. PATENT DOCUMENTS

| | | | |
|---|---|---|---|
| 4,260,673 | 4/1981 | Krech | 430/143 |
| 4,600,669 | 7/1986 | Ng et al. | 430/47 |
| 4,614,521 | 9/1986 | Niwa et al. | 430/201 |
| 4,713,365 | 12/1987 | Harrison | 430/945 |
| 4,716,144 | 12/1986 | Vanier et al. | 430/945 |
| 4,923,848 | 5/1990 | Akada et al. | 503/227 |
| 5,053,381 | 10/1991 | Chapman et al. | 503/227 |
| 5,094,931 | 3/1992 | Platzer | 430/258 |
| 5,126,760 | 6/1992 | DeBoer | 346/108 |
| 5,158,927 | 10/1992 | Bailey et al. | 430/201 |
| 5,166,126 | 11/1992 | Harrison et al. | 430/201 |

Primary Examiner—Charles L. Bowers, Jr.
Assistant Examiner—Martin Angebranndt
Attorney, Agent, or Firm—Andrew J. Anderson

[57] ABSTRACT

A process for forming a color image which may be used to represent a printed color image to be obtained from a printing press comprising (a) forming a thermal dye transfer image in a polymeric dye image-receiving layer of an intermediate dye-receiving element by imagewise-heating a dye-donor element and transferring a dye image to the dye image-receiving layer, (b) laminating a polymeric dye-migration barrier layer to the imaged dye image-receiving layer, and (c) laminating the dye-migration barrier layer and imaged dye image-receiving layer together to the surface of a paper substrate. By applying a dye-migration barrier layer to the imaged dye image-receiving layer and subsequently laminating both layers to the paper substrate together, the final paper substrate is subjected to only a single lamination step, and wrinkles caused by multiple laminations can be virtually eliminated.

19 Claims, No Drawings

DUAL LAMINATE PROCESS FOR THERMAL COLOR PROOFING

This invention relates to a thermal dye transfer process for obtaining a color image which may be used to represent a printed image to be obtained from a printing press, and more particularly to the use of a dye migration barrier layer in the resulting color image.

In order to approximate the appearance of continuous-tone (photographic) images via ink-on-paper printing, the commercial printing industry relies on a process known as halftone printing. In halftone printing, color density gradations are produced by printing patterns of dots of various sizes, but of the same color density, instead of varying the color density uniformly as is done in photographic printing.

There is an important commercial need to obtain a color proof image before a printing press run is made. It is desired that the color proof will accurately represent the image quality, details, color tone scale and, in many cases, the halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled. U.S. Pat. No. 4,600,669 of Ng et al., for example, discloses an electrophotographic color proofing system.

In U.S. Pat. No. 5,126,760 the disclosure of which is incorporated by reference, a thermal dye transfer process is described for producing a direct digital, halftone color proof of an original image. The proof is used to represent a printed color image obtained from a printing press. The process described therein comprises:
a) generating a set of electrical signals which is representative of the shape and color scale of an original image;
b) contacting a dye-donor element comprising a support having thereon a dye layer and an infrared-absorbing material with a first intermediate dye-receiving element comprising a support having thereon a polymeric, dye image-receiving layer;
c) using the signals to imagewise-heat by means of a diode laser the dye-donor element, thereby transferring a dye image to the first dye-receiving element; and
d) retransferring the dye image to a second final dye image-receiving element which has the same substrate as the printed color image.

As set forth in U.S. Pat. No. 5,126,760 described above, an intermediate dye-receiving element is used with subsequent retransfer to a second receiving element to obtain the final color proof. This is similar to the electrophotographic color proofing system of Ng et al. referred to above, which discloses forming a composite color image on a dielectric support with toners and then laminating the color image and support to a substrate to simulate a color print expected from a press run. In both processes, the second or final receiving element can have the same substrate as that to be used for the actual printing press run. This allows a color proof to be obtained which most closely approximates the look and feel of the printed images that will be obtained in the actual printing press run. A multitude of different substrates can be used to prepare the color proof (the second receiver); however, there needs to be employed only one intermediate receiver.

For thermal dye transfer color proofing, the intermediate receiver can be optimized for efficient dye uptake without dye-smearing or crystallization. In the retransfer step, the dyes and receiver binder may be transferred together to the second receiver, or the dyes alone may be transferred where the second receiver is receptive to the dyes. Preferably, the dyes and receiver binder are transferred together to the final color proof receiver in order to maintain image sharpness and overall quality, which may be lessened when the dyes are retransferred alone to the final receiver. This is similar to the electrophotographic color proofing system of Ng et al. which discloses transferring a separable dielectric polymeric support layer together with the composite toner image from an electrophotographic element to the final receiver substrate.

While thermal dye transfer color proofing systems as described above have substantial advantages, it has been found that even where the transferred dyes and binder of the intermediate receiver are transferred together to the final color proof paper stock, a dye image spread or smear problem may result due to dyes migrating from the transferred binder to the paper stock. Such image smear can be particularly detrimental for halftone patterns in view of the minute dot size used to form such patterns. It would be desirable to provide a thermal dye transfer process for obtaining a high quality color proof which would minimize such a dye smear problem and which would be applicable to a variety of printer stock papers.

U.S. Pat. No. 5,053,381 of Chapman et al. discloses a thermal dye transfer color proofing system wherein a polymeric dye-migration barrier layer is applied to the surface of the final color proof paper stock substrate prior to transferring the imaged polymeric dye image-receiving layer of the intermediate dye-receiving element to the paper substrate. The application of the polymeric dye-migration barrier layer and the transfer of the imaged polymeric dye image-receiving layer are both preferably done by heated laminations. By applying a dye-migration barrier layer to the paper substrate prior to transfer of the imaged polymeric dye image-receiving layer, dye smear and spreading due to migration of dye into the paper can be minimized.

It has been found, however, that when the polymeric dye-migration barrier layer and imaged polymeric dye image-receiving layer are sequentially transferred to the final color paper proof stock substrate by heated lamination, wrinkles may occur in the final paper substrate, apparently due to the final paper substrate being subjected to two heated laminations. It would be desirable to provide a thermal dye transfer process for obtaining a high quality color proof applicable to a variety of printer stock papers which would minimize such a wrinkle problem, while still solving the dye smear problem.

These and other objects of the invention are achieved in accordance with the process of this invention which comprises (a) forming a thermal dye transfer image in a polymeric dye image-receiving layer of an intermediate dye-receiving element by imagewise-heating a dye-donor element and transferring a dye image to the dye image-receiving layer, (b) laminating a polymeric dye-migration barrier layer to the imaged polymeric dye image-receiving layer, and (c) laminating the dye-migration barrier layer and imaged dye image-receiving layer together to the surface of a paper substrate. By applying a dye-migration barrier layer to the imaged dye image-receiving layer and subsequently laminating both layers to the paper substrate together, the final paper substrate is subjected to only a single lamination step, and wrinkles can be virtually eliminated while dye smear and spreading due to migration of dye into the paper is still minimized and a high quality color image can be obtained.

The dye-donor element that is used in the process of the invention comprises a support having thereon a heat transferable dye-containing layer. The use of dyes in the dye-donor rather than pigments permits a wide selection of hue and color that enables a closer match to a variety of printing inks and also permits easy transfer of images one or more times to a receiver if desired. The use of dyes also allows easy modification of density to any desired level.

Any dye can be used in the dye-donor employed in the invention provided it is transferable to the dye-receiving layer by the action of heat. Especially good results have been obtained with sublimable dyes such as anthraquinone dyes, e.g., Sumikalon Violet RS®️ (product of Sumitomo Chemical Co., Ltd.), Dianix Fast Violet 3R-FS®️ (product of Mitsubishi Chemical Industries, Ltd.), and Kayalon Polyol Brilliant Blue N-BGM®️ and KST Black 146®️ (products of Nippon Kayaku Co., Ltd.); azo dyes such as Kayalon Polyol Brilliant Blue BM®️, Kayalon Polyol Dark Blue 2BM®️, and KST Black KR®️ (products of Nippon Kayaku Co., Ltd.), Sumickaron Diazo Black 5G®️ (product of Sumitomo Chemical Co., Ltd.), and Miktazol Black 5GH®️ (product of Mitsui Toatsu Chemicals, Inc.); direct dyes such as Direct Dark Green B®️ (product of Mitsubishi Chemical Industries, Ltd.) and Direct Brown M®️ and Direct Fast Black D®️ (products of Nippon Kayaku Co. Ltd.); acid dyes such as Kayanol Milling Cyanine 5R®️ (product of Nippon Kayaku Co. Ltd.); basic dyes such as Sumicacryl Blue 6G®️ (product of Sumitomo Chemical Co., Ltd.), and Aizen Malachite Green®️ (product of Hodogaya Chemical Co., Ltd.); or any of the dyes disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination.

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p.55. Preferred dyes and dye combinations found to best match the SWOP Color References are the subject matter of U.S. Pat. Nos. 5,023,229, 5,024,990, and 5,081,101, the disclosures of which are incorporated by reference.

The dyes of the dye-donor element employed in the invention may be used at a coverage of from about 0.05 to about 1 g/m$^2$, and are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U. S. Pat. No. 4,700,207; a polycarbonate; polyvinyl acetate; poly(styrene-co-acrylonitrile); a poly(sulfone); a polyvinylacetal such as poly(vinyl alcohol-co-butyral) or a poly(phenylene oxide). The binder may be used at a coverage of from about 0.1 to about 5 g/m$^2$.

The dye layer of the dye-donor element may be coated on the support or printed thereon by a printing technique such as a gravure process.

Any material can be used as the support for the dye-donor element employed in the invention provided it is dimensionally stable and can withstand the heat needed to transfer the sublimable dyes. Such materials include polyesters such as poly(ethylene terephthalate); polyamides; polycarboates; cellulose esters such as cellulose acetate; fluorine polymers such as polyvinylidene fluoride or poly(tetrafluoroethylene-cohexafluoropropylene); polyethers such as polyoxymethylene; polyacetals; polyolefins such as polystyrene, polyethylene, polypropylene or methylpentene polymers; and polyimides such as polyimide-amides and polyetherimides. The support generally has a thickness of from about 5 to about 200 μm. It may also be coated with a subbing layer, if desired, such as those materials described in U.S. Pat. Nos. 4,695,288 or 4,737,486.

The intermediate or first dye-receiving element that is used in the process of the invention comprises a support having thereon a dye image-receiving layer. The support may be a polymeric film such as a poly(ether sulfone), a polyimide, a cellulose ester such as cellulose acetate, a poly(vinyl alcohol-co-acetal) or a poly(ethylene terephthalate). The intermediate support thickness is not critical, but should provide adequate dimensional stability. In general, polymeric film supports of from 5 to 500 μm are used. The intermediate dye-receiving element support may be clear, opaque, and/or diffusely or specularly reflective. Opaque (e.g. resin coated paper) and reflective (e.g. metal coated polymeric film) supports are preferred when a laser system is used to form the dye image in the dye image-receiving layer, and such supports are the subject matter of copending, commonly assigned U.S. Ser. No. 606,404 of Kaszczuk et al., the disclosure of which is incorporated by reference.

The dye image-receiving layer may comprise, for example, a polycarbonate, a polyurethane, a polyester, polyvinyl chloride, cellulose esters such as cellulose acetate butyrate or cellulose acetate propionate, poly(styrene-co-acrylonitrile), poly(caprolactone), polyvinyl acetals such as poly(vinyl alcohol-co-butyral), mixtures thereof, or any other conventional polymeric dye-receiver material provided it will adhere to the second receiver. The dye image-receiving layer may be present in any amount which is effective for the intended purpose. In general, good results have been obtained at a concentration of from about 0.2 to about 5 g/m$^2$.

The dye-donor elements employed in the invention may be used with various methods of heating in order to transfer dye to the intermediate receiver. For example, a resistive thermal head or a laser may be used.

When a laser is used, it is preferred to use a diode laser since it offers substantial advantages in terms of its small size, low cost, stability, reliability, ruggedness, and ease of modulation. In practice, before any laser can be used to heat a dye-donor element, the element must contain an infrared-absorbing material. The laser radiation is then absorbed into the dye layer and converted to heat by a molecular process known as internal conversion.

Lasers which can be used to transfer dye from dye-donors employed in the invention are available commercially. There can be employed, for example, Laser Model SDL-2420-H2 from Spectro Diode Labs, or Laser Model SLD 304 V/W from Sony Corp.

In the above process, multiple dye-donors may be used to obtain a complete range of colors in the final image. For example, for a full-color image, four colors: cyan, magenta, yellow and black are normally used.

Thus, in a preferred embodiment of the process of the invention, a dye image is transferred by imagewise heating a dye-donor containing an infrared-absorbing material with a diode laser to volatilize the dye, the diode laser beam being modulated by a set of signals which is representative of the shape and color of the original image, so that the dye is heated to cause volatilization only in those areas in which its presence is required on the dye-receiving layer to reconstruct the color of the original image.

Spacer beads may be employed in a separate layer over the dye layer of the dye-donor in the above-described laser process in order to separate the dye-donor from the dye-receiver during dye transfer, thereby increasing its uniformity and density. That invention is more fully described in U.S. Pat. No. 4,772,582, the disclosure of which is hereby incorporated by reference. Alternatively, the spacer beads may be employed in or on the receiving layer of the dye-receiver as described in U.S. Pat. No. 4,876,235, the disclosure of which is hereby incorporated by reference. The spacer beads may be coated with a polymeric binder if desired.

In a further preferred embodiment of the invention, an infrared-absorbing dye is employed in the dye-donor element instead of carbon black in order to avoid desaturated colors of the imaged dyes from carbon contamination. The use of an absorbing dye also avoids problems of uniformity due to inadequate carbon dispersing. For example, cyanine infrared absorbing dyes may be employed as described in U.S. Pat. No. 4,973,572. Other materials which can be employed are described in U.S. Pat. Nos. 4,912,083, 4,942,141, 4,948,776, 4,948,777, 4,948,778, 4,950,639, 4,950,640, 4,952,552, 5,019,480, 5,034,303, 5,035,977, and 5,036,040.

A thermal printer which uses the laser described above to form an image on a thermal print medium is described and claimed in copending U.S. patent application Ser. No. 451,656 of Baek and DeBoer, filed Dec. 18, 1989, the disclosure of which is hereby incorporated by reference.

As noted above, after the dye image is obtained on a first intermediate dye-receiving element, a dye-migration barrier layer is laminated to the imaged dye image-receiving layer. The dye-migration barrier layer may be any material which limits the tendency of the transferred halftone dye image dots from spreading due to migrating into the paper substrate. Materials generally useful are those used as polymeric binders in the dye layer of the dye-donor element described above and polymers used for the dye image-receiving layer of the intermediate dye-receiving element. The dye-migration barrier layer is preferably thin so as to not affect the appearance of the final color image, while still thick enough to provide adequate protection against migration of the dye image into the paper substrate. In general, coverages of from 0.1 to 5 $g/m^2$ are preferred for polymeric dye-migration barrier layers.

The dye-migration barrier layer may be applied to the imaged dye-image receiving layer by any conventional method. In a preferred embodiment, the dye-migration barrier layer is a polymeric layer preformed on a temporary support, which is then laminated to the imaged dye-image receiving layer. The support can then be separated from the dye-migration barrier layer. This layer application can be accomplished, for example, by passing the imaged first dye-receiving element and the dye-migration barrier layer with support between a pair of heated rollers to form a laminate, and then stripping the support away. Alternatively, the intermediate dye-receiving element support may be stripped instead of the dye-migration barrier layer support, leaving the dye-migration barrier layer support as the support for the laminated layers. Other methods of transferring the dye-migration barrier layer from its support to the imaged first dye-receiving element could also be used such as using a heated platen, using a resistive thermal head, other conventional use of pressure and/or heat, external heating, etc. To facilitate separation, release agents may be included within or between the dye-migration barrier layer and its support. For example, conventional silicone based materials or hydrophilic cellulosic materials may be used. Useful supports for the dye-migration barrier layer include those listed above for the intermediate dye-receiving element.

After the imaged dye-image receiving layer and the dye-migration barrier layer are laminated together, a final color proof is formed by transferring the dye-migration barrier layer and imaged dye image-receiving layer together to the surface of a final receiver paper substrate. The substrate thickness is not critical and may be chosen to best approximate the prints to be obtained in the actual printing press run. Examples of substrates which may be used for the final receiving element (color proof) include the following: Adproof ® (Appleton Paper), Flo Kote Cove ® (S. D. Warren Co.), Champion Textweb ® (Champion Paper Co.), Quintessence Gloss ® (Potlatch Inc.), Vintage Gloss ® (Potlatch Inc.), Khrome Kote ® (Champion Paper Co.), Consolith Gloss ® (Consolidated Papers Co.) and Mountie Matte ® (Potlatch Inc.).

The laminated imaged dye image-receiving layer and dye-migration barrier layer may be transferred to the final receiver (color proof substrate) in a similar manner of passing between two heated rollers, use of a heated platen, use of a resistive thermal head, use of other forms of pressure and/or heat, external heating, etc., to form a laminate. The laminated layers may be laminated to the final substrate with the dye-migration barrier layer adhered to the final receiver substrate (when the dye-migration barrier layer temporary support has been previously removed), or alternatively with the imaged intermediate dye image-receiving layer adhered to the final substrate (when the intermediate receiver element temporary support has been previously removed). Preferably, the remaining temporary support is separated from the laminated layers after they are laminated to the final substrate. Release agents as described above may also be included between or within the intermediate receiver support and dye image-receiving layer to facilitate separation. The use of release layers comprising mixtures of hydrophilic cellulosic materials and polyethyleneglycol between metal coated supports and dye image-receiving layers is the subject matter of U.S. Pat. No. 5,077,263 of Henzel, the disclosure of which is incorporated by reference.

Also as noted above, a set of electrical signals is generated which is representative of the shape and color of an original image. This can be done, for example, by scanning an original image, filtering the image to separate it into the desired basic colors (red, blue and green), and then converting the light energy into electrical energy. The electrical signals are then modified by computer to form he color separation data which may be used to form a halftone color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference.

The dye-donor element employed in the invention may be used in sheet form or in a continuous roll or ribbon. If a continuous roll or ribbon is employed, it may have alternating areas of different dyes or dye mixtures, such as sublimable cyan and/or yellow and/or magenta and/or black or other dyes. Such dyes, for example, are disclosed in the co-pending applications referred to above.

The following examples are provided to illustrate the invention.

EXAMPLE

Intermediate dye-receiving elements and dye-migration barrier layer elements were prepared by coating on a 100 μm thick poly(ethylene terephthalate) support the following layers:

a) Stripping layer of Natrosol 250LR (hydroxy ethyl cellulose) (Aqualon Co.) (0.22 g/m$^2$), polyethylene glycol (MW~8000) (Kodak Laboratory Chemicals) (0.11 g/m$^2$), and 10G (a nonylphenol-glycidol surfactant) (Olin Corp.) (0.01 g/m$^2$) from water.

b) Polymeric layer of the polymer, A to D indicated below (4.0 g/m$^2$), containing crosslinked poly(styrene-co-divinyl benzene) beads (12 micron average diameter) (0.09 g/:m$^2$), and 510 Silicone Fluid (Dow Corning Corp) (0.01 g/m$^2$) from a butanone and cyclopentanone solvent mixture.

Polymers

A. Vylon 200 (a synthetic polyester resin) (Toyobo KK)

B. A linear condensation polycarbonate considered to be derived from carbonic acid, bisphenol-A, and diethylene glycol (bisphenol: glycol ratio of 1:1) (described in U.S. Pat. No. 4,927,803)

C. UCAR VAGF (a high molecular weight vinyl chloride-hydroxyl containing copolymer) (Union Carbide Co.)

D. Butvar B-76 (poly(vinyl alcohol-co-butyral) with approximately 10% alcohol content) (Monsanto Corp.)

For examples according to the invention, a large format (approximately 35×55 cm) polyomeric dye-migration barrier layer element was laminated face to face to a large format polymeric intermediate receiver layer element by passage through a set of juxtaposed rollers at a rate of 30 cm/min. The rollers were of 10 cm diameter. An upper compliant silicone rubber powered roller was heated to 135°-140° C., while a lower Teflon coated steel roller was heated to 115°-120° C. with a nip temperature of 127° C. and force between the rollers of 36N. The temporary support from the barrier layer element was peeled off. A paper substrate of Textweb 60 pound paper stock (Champion Papers) was applied to the barrier layer side of the stripped laminate and passed through the roller set. The second temporary support from the intermediate receiver layer element was peeled off, and the paper stock with dual polymeric layers was examined for surface wrinkles. The results are presented in Table I below.

For comparison examples, a large format polymeric dye-migration barrier layer element was laminated to a paper substrate of Textweb 60 pound paper stock by passage through a heated roller set as described above, and the temporary support was removed. The polymeric layer side of this laminate was laminated face-to-face with a polymeric intermediate receiver layer element by passage through the roller set. The temporary support of the intermediate receiver layer element was removed, and the paper stock with dual polymeric layers was examined for surface wrinkles. The results are presented in Table I below.

TABLE I

| As Barrier Layer | As Intermediate Receiver | Process | Wrinkles Observed on Final Substrate |
|---|---|---|---|
| A | A | Invention | None |
| A | B | Invention | None |
| B | B | Invention | None |
| A | C | Invention | None |
| B | C | Invention | None |
| C | C | Invention | None |
| A | D | Invention | None |
| B | D | Invention | None |
| C | D | Invention | None |
| D | D | Invention | None |
| A | A | Comparison | Yes |
| A | B | Comparison | Yes |
| B | B | Comparison | Yes |
| A | C | Comparison | Yes |
| B | C | Comparison | Yes |
| C | C | Comparison | Yes |
| A | D | Comparison | Yes |
| B | D | Comparison | Yes |
| C | D | Comparison | Yes |
| D | D | Comparison | Yes |

In no case were substantial wrinkles observed for the examples corresponding to the process of the invention, while the samples produced by the comparison process showed wrinkles in all cases to one degree or another.

The above examples employed receiving elements that did not contain any transferred dye image, as thermal dye-transfer imaging is not necessary to illustrate the concept of the invention. Imaging of the intermediate dye image receiving layer elements may be performed using dye donor elements and printing processes as set forth in Examples 1-4 of U.S. Pat. No. 5,053,381, incorporated by reference above.

The invention has been described in detail with particular reference to preferred embodiments thereof, but it will be understood that variations and modifications can be effected within the spirit and scope of the invention.

What is claimed is:

1. A process for forming a color image comprising:
  (a) forming a thermal dye transfer image in a polymeric dye image-receiving layer of an intermediate dye-receiving element comprising an intermediate support bearing on one surface thereof the dye image-receiving layer by imagewise-heating a dye-donor element and transferring a dye image to the dye image-receiving layer, (b) laminating an element comprising a temporary support having on one surface thereof a polymeric dye-migration barrier layer to the imaged intermediate dye-receiving element such that the barrier layer is adhered to the imaged dye image-receiving layer, and thereafter separating the temporary support from the barrier layer, and (c) laminating the dye-migration barrier layer and imaged dye image-receiving layer together to the surface of a paper substrate such that the dye-migration barrier layer is adhered to the paper substrate.

2. The process of claim 1 wherein the intermediate support is thereafter separated from the dye image-receiving layer.

3. The process of claim 1 wherein the dye-migration barrier layer and the dye image-receiving layer both comprise the same polymer.

4. The process of claim 3 wherein the polymer is a poly(vinyl alcohol-co-butyral).

5. The process of claim 3 wherein the polymer is a polyester.

6. The process of claim 3 wherein the polymer is a polycarbonate.

7. The process of claim 1 wherein the dye-migration barrier layer and the dye image-receiving layer comprise different polymers.

8. The process of claim 1 wherein step (a) comprises (i) generating a set of electrical signals which is representative of the shape and color scale of an original image, (ii) contacting a dye-donor element comprising a support having thereon a dye layer and an infrared-absorbing material with an intermediate dye-receiving element comprising an intermediate support having thereon the dye image-receiving layer, and iii) using the signals to imagewise-heat by means of a diode laser the dye-donor element, thereby transferring a dye image to the intermediate dye-receiving element.

9. The process of claim 8 wherein the thermal dye transfer image comprises a halftone color image.

10. The process of claim 1 wherein the thermal dye transfer image comprises a halftone color image.

11. A process for forming a color image comprising:

(a) forming a thermal dye transfer image in a polymeric dye image-receiving layer of an intermediate dye-receiving element comprising an intermediate support bearing on one surface thereof the dye image-receiving layer by imagewise-heating a dye-donor element and transferring a dye image to the dye image-receiving layer, (b) laminating an element comprising a temporary support having on one surface thereof a polymeric dye-migration barrier layer to the imaged intermediate dye-receiving element such that the barrier layer is adhered to the imaged dye image-receiving layer, and thereafter separating the intermediate support from the dye image-receiving layer, and (c) laminating the imaged dye image-receiving layer and dye-migration barrier layer together to the paper substrate such that the dye image-receiving layer is adhered to the paper substrate, and thereafter separating the temporary support form the dye-migration barrier layer.

12. The process of claim 11 wherein the dye-migration barrier layer and the dye image-receiving layer both comprise the same polymer.

13. The process of claim 12 wherein the polymer is a poly(vinyl alcohol-co-butyral).

14. The process of claim 12 wherein the polymer is a polyester.

15. The process of claim 12 wherein the polymer is a polycarbonate.

16. The process of claim 11 wherein the dye-migration barrier layer and the dye image-receiving layer comprise different polymers.

17. The process of claim 11 wherein step (a) comprises (i) generating a set of electrical signals which is representative of the shape and color scale of an original image, (ii) contacting a dye-donor element comprising a support having thereon a dye layer and an infrared-absorbing material with an intermediate dye-receiving element comprising an intermediate support having thereon the dye image-receiving layer, and iii) using the signals to imagewise-heat by means of a diode laser the dye-donor element, thereby transferring a dye image to the intermediate dye-receiving element.

18. The process of claim 17 wherein the thermal dye transfer image comprises a halftone color image.

19. The process of claim 11 wherein the thermal dye transfer image comprises a halftone color image.

* * * * *